(12) United States Patent
Shea

(10) Patent No.: US 10,529,651 B2
(45) Date of Patent: Jan. 7, 2020

(54) CO-PACKAGED DIE ON LEADFRAME WITH COMMON CONTACT

(71) Applicant: Great Wall Semiconductor Corporation, Tempe, AZ (US)

(72) Inventor: Patrick M. Shea, Oviedo, FL (US)

(73) Assignee: Great Wall Semiconductor Corporation, Tempe, AZ (US)

( * ) Notice: Subject to any disclaimer, the term of this patent is extended or adjusted under 35 U.S.C. 154(b) by 0 days.

(21) Appl. No.: 15/080,780

(22) Filed: Mar. 25, 2016

(65) Prior Publication Data

US 2016/0284629 A1 Sep. 29, 2016

Related U.S. Application Data

(60) Provisional application No. 62/138,943, filed on Mar. 26, 2015.

(51) Int. Cl.
*H01L 23/495* (2006.01)
*H01L 25/00* (2006.01)
*H01L 21/48* (2006.01)
*H01L 21/56* (2006.01)
*H01L 23/31* (2006.01)
*H01L 25/07* (2006.01)
*H01L 21/60* (2006.01)

(52) U.S. Cl.
CPC .... *H01L 23/4951* (2013.01); *H01L 23/49562* (2013.01); *H01L 2021/60022* (2013.01)

(58) Field of Classification Search
CPC ....... H01L 23/495; H01L 25/00; H01L 21/48; H01L 21/56; H01L 23/31; H01L 25/07; H01L 23/4951; H01L 23/49541; H01L 23/3107; H01L 23/49562; H01L 2924/181; H01L 21/561; H01L 2224/16245; H01L 2021/60022; H01L 2924/00012
USPC .......................................... 257/676
See application file for complete search history.

(56) References Cited

U.S. PATENT DOCUMENTS

| 8,546,221 B2 | 10/2013 | Girdhar et al. | |
| 2004/0061221 A1* | 4/2004 | Schaffer | H01L 24/36 257/723 |
| 2005/0285238 A1* | 12/2005 | Joshi | H01L 23/49562 257/673 |
| 2011/0008933 A1* | 1/2011 | Noquil | H01L 23/4334 438/108 |
| 2011/0109287 A1* | 5/2011 | Nakamura | H01L 23/3107 323/282 |

(Continued)

FOREIGN PATENT DOCUMENTS

WO  WO 2014127861 A1 *  8/2014  ........... G01D 11/245

OTHER PUBLICATIONS

Xiao Y. et al., "Flip-Chip Flex-Circuit Packaging for Power Electronics", Proceedings of 2001 International Symposium on Power Semiconductor Devices & ICs, Osaka, 4 pages, 2001.

(Continued)

*Primary Examiner* — Caleen O Sullivan
(74) *Attorney, Agent, or Firm* — Foley & Lardner LLP

(57) ABSTRACT

A leadframe includes a common contact. A first transistor is disposed over the leadframe with a first interconnect structure of the first transistor disposed over the common contact. A second transistor is disposed over the leadframe with a second interconnect structure of the second transistor disposed over the common contact.

18 Claims, 7 Drawing Sheets

(56) References Cited

U.S. PATENT DOCUMENTS

| | | | | |
|---|---|---|---|---|
| 2011/0278709 A1* | 11/2011 | Lu | ........................... | H01L 24/37 |
| | | | | 257/676 |
| 2013/0154073 A1* | 6/2013 | Massie | .............. | H01L 23/49524 |
| | | | | 257/676 |
| 2014/0239472 A1* | 8/2014 | Jones | ...................... | H01L 24/49 |
| | | | | 257/676 |

OTHER PUBLICATIONS

Kono, H. et al., "High-Speed and Low Switching Loss Operation of 1700 V 60 a SiC MOSFETs Installed in Low Parasitic Inductance Module", Proceedings of the 26th International Symposium on Power Semiconductor Devices & IC's, Jun. 15-19, 2014 Waikoloa, Hawaii, pp. 289-292.

* cited by examiner

US 10,529,651 B2

CO-PACKAGED DIE ON LEADFRAME WITH COMMON CONTACT

CLAIM OF DOMESTIC PRIORITY

The present application claims the benefit of U.S. Provisional Application No. 62/138,943, filed Mar. 26, 2015, which application is incorporated herein by reference.

DETAILED DESCRIPTION OF THE DRAWINGS

The present invention is described in one or more embodiments in the following description with reference to the figures, in which like numerals represent the same or similar elements. While the invention is described in terms of the best mode for achieving objectives of the invention, those skilled in the art will appreciate that the disclosure is intended to cover alternatives, modifications, and equivalents as may be included within the spirit and scope of the invention as defined by the appended claims and claims equivalents as supported by the following disclosure and drawings.

Figure 1A:
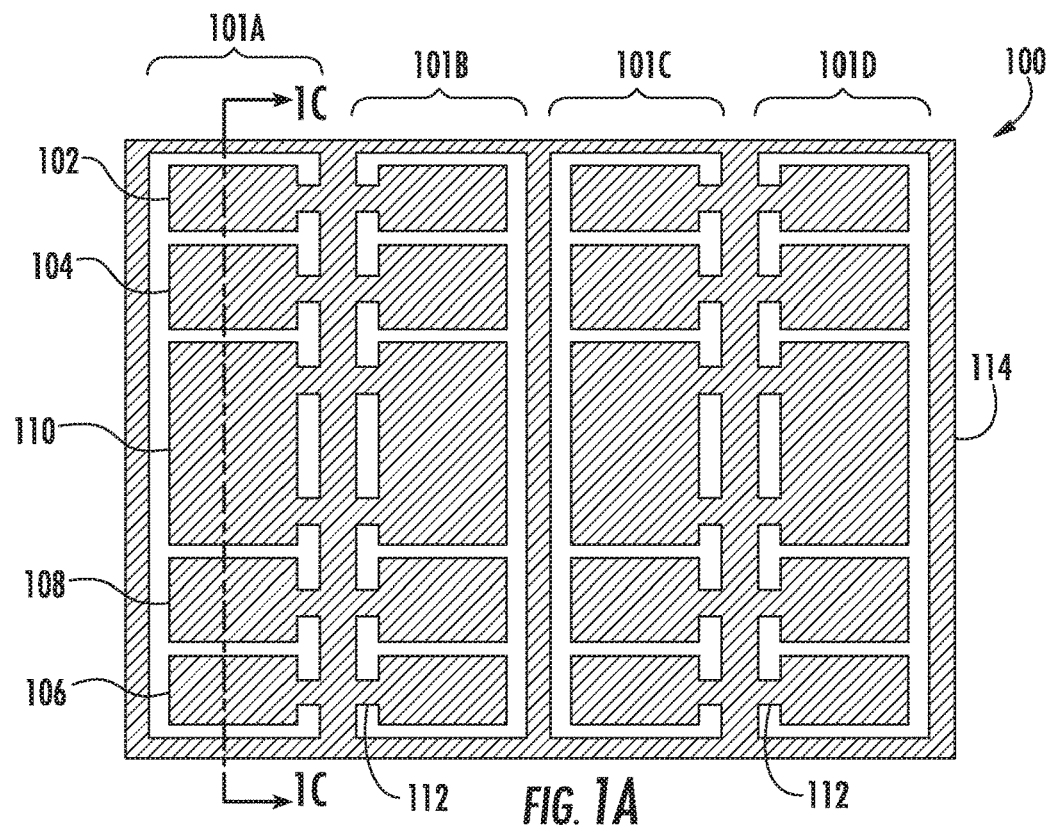
FIGS. 1A-1C illustrate leadframes with common contacts.

FIG. 1A illustrates a leadframe 100. A leadframe is an electrically conductive structure within a semiconductor package that transmits electrical signals from one or more semiconductor die mounted over the leadframe to contacts on a printed circuit board (PCB) or other substrate. Semiconductor die are mounted on leadframe 100 as illustrated in FIGS. 3A-3F, and then a semiconductor package is completed by encapsulation and singulation as illustrated in FIGS. 4A-4C. After singulation, the semiconductor die mounted on leadframe 100 remain electrically connected to leadframe 100 within the package. Leadframe 100 includes bottom and side surfaces that remain exposed from the completed package. The exposed surfaces of leadframe 100 are electrically connected to a PCB or other substrate to interface with other electrical components.

Leadframe 100 includes four device formation areas 101A, 101B, 101C, and 101D. Each device formation area 101A-101D includes separated contacts 102, 104, 106, and 108, and a common contact 110 for mounting semiconductor die. Connecting portions 112 of leadframe 100 physically connects each contact 102-110 to a frame 114. Frame 114 holds the contacts 102-110 for multiple end devices in an orientation useful by manufacturing equipment to pick-and-place semiconductor die onto leadframe 100. While leadframe 100 includes four device formation areas 101A-101D, leadframes in practice may be used to manufacture tens, hundreds, or more devices at once. A leadframe 100 is made with any number of device formation areas 101, each having contacts 102-110 connected to frame 114 by connecting portions 112.

Leadframe 100 is formed by etching a conductive sheet into a plurality of device formation areas 101. A sheet of conductive material is provided that is at least as large as the desired leadframe 100 to be formed. The sheet of conductive material includes one or more layers of aluminum (Al), copper (Cu), tin (Sn), iron (Fe), nickel (Ni), gold (Au), silver (Ag), titanium (Ti), tungsten (W), alloys thereof, or other suitable electrically conductive material. In one embodiment, leadframe 100 is formed from a sheet of copper or a copper alloy.

The conductive sheet is etched to remove the conductive material in the desired empty areas between contacts 102-110 and frame 114 to form leadframe 100. The conductive sheet is etched by disposing a photoresist layer over the conductive sheet and patterning the photoresist layer into the desired shape of leadframe 100. The photoresist layer is patterned by exposing the photoresist layer to ultraviolet (UV) light and developing the photoresist material. The UV light exposure and developing of the photoresist changes physical properties of the photoresist layer so that regions of the photoresist layer between contacts 102-110 and frame 114 are removable while leaving the photoresist layer over contacts 102-110, frame 114, and connecting portions 112. The portions of the conductive sheet outside of contacts 102-110, connecting portions 112, and frame 114 are not protected by the photoresist layer and are removed by wet etching, dry etching, deep reactive-ion etching, or another appropriate metal etching process. In some embodiments, the conductive sheet is cut to a smaller size after etching is complete to create a plurality of leadframes 100 at a size desired for further processing.

The completed leadframe 100, after being etched, includes a plurality of device formation areas 101. Leadframe 100 in FIG. 1A includes four device formation areas 101A, 101B, 101C, and 101D. Each device formation area 101 includes four separated contacts 102, 104, 106, and 108, and a common contact centrally located in each device formation area 101. Each device formation area 101 is configured to have a pair of three-terminal semiconductor die mounted onto each device formation area 101 using contacts 102-110 as contact pads. In some embodiments, a three-terminal semiconductor die, e.g., a transistor, may be paired with a two-terminal semiconductor die, e.g., a diode. One of the separated contacts 102-108 is not used. In some embodiments, leadframe 100 is provided without one of the separated contacts 102-108 when a two-terminal semiconductor die is used. Each common contact 110 extends between two semiconductor die mounted over leadframe 100. Common contacts 110 provide a relatively short and wide electrical connection between terminals of two semiconductor die. Common contact 110 extends between two die with a substantially uniform width without a conductive trace or other thinner portion of common contact 110 between the semiconductor die.

The semiconductor die disposed over leadframe 100 are complementary transistor devices in some embodiments. Each transistor device includes a gate terminal, a source terminal, and a drain terminal in the case of field-effect transistors (FETs), or a base terminal, collector terminal, and an emitter terminal in the case of bipolar junction transistors (BJTs). Source and drain terminals of a FET are conduction terminals, and the gate terminal is a control terminal that controls electric current between the source and drain. Emitter and collector terminals of a BJT are conduction terminals, and the base terminal is a control terminal that controls electric current between the emitter and collector.

Two semiconductor die are disposed in each device formation area 101 to be co-packaged. One semiconductor die includes terminals disposed over and electrically connected to separated contact 102, separated contact 104, and common contact 110. A second semiconductor die includes contacts or terminals disposed over and electrically connected to separated contact 106, separated contact 108, and common contact 110. Each of the semiconductor die paired within each device formation area 101 has one terminal disposed over and electrically connected to common contact 110. Common contact 110 provides a short electrical path between a terminal of a first semiconductor die and a terminal of a second semiconductor die.

Leadframe 100 is one leadframe embodiment used to form leadless semiconductor packages. A leadless package indicates that the leads of the package, i.e., contacts 102-110, do not extend outside of a footprint of the package. After encapsulation of semiconductor die mounted on leadframe 100, contacts 102-110 are exposed from a bottom surface of the encapsulant. In some embodiments, leadframe 100 is singulated such that side surfaces of contacts 102-110 are exposed from side surfaces of the encapsulant. Contacts 102-110 are directly soldered to a PCB or other substrate using surface-mount technology.

Figure 1B:
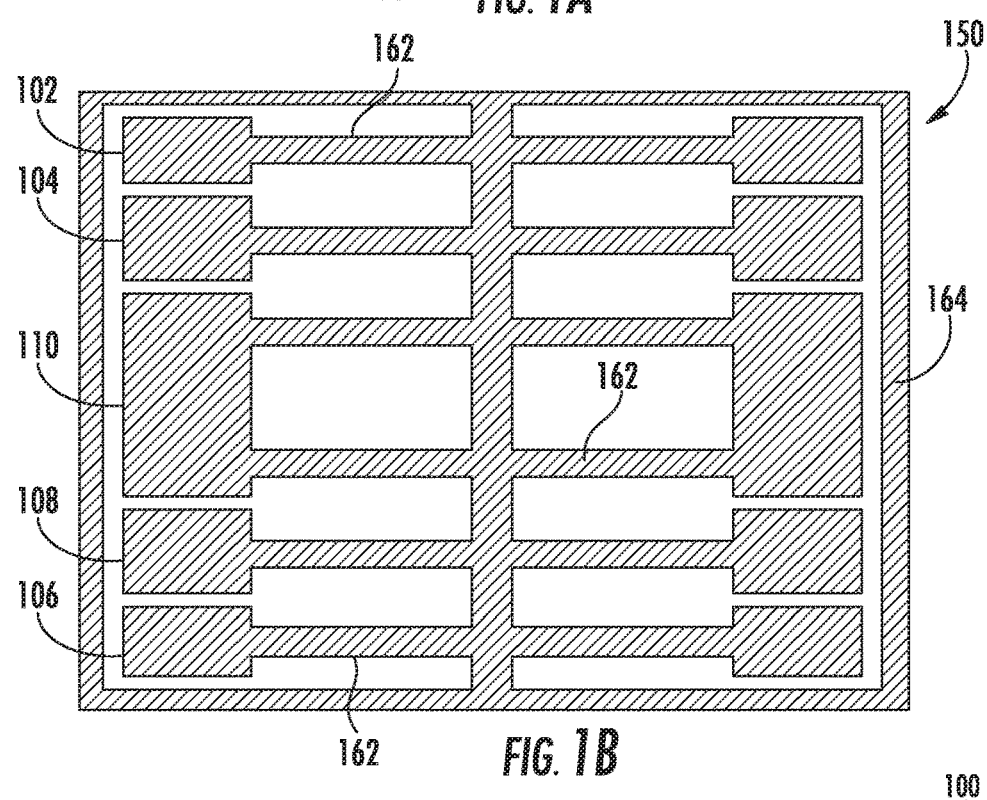

In other embodiments, contacts 102-110 have leads extending from each contact 102-110 outside of a final semiconductor package. FIG. 1B illustrates leadframe 150, with leads 162 extending from frame 164 to contacts 102-110. A final semiconductor package based on leadframe 150 is encapsulated with leads 162 extending from the encapsulant. Leads 162 are used to electrically connect the final packaged product to a PCB or other substrate. In one embodiment, leads 162 extend through openings in the substrate. A solder connection physically holds leads 162 into the openings and electrically connects the leads to contact pads formed around the openings. In other embodiments, leads 162 are bent such that a portion of leads 162 is approximately coplanar with a surface of the semiconductor package. Leads 162 are used to surface-mount the semiconductor package to contact pads on a PCB or other substrate. Other lead configurations are used along with separated contacts 102-108 and common contact 110 in other embodiments.

Separated contacts 102, 104, 106, and 108 are referred to as separated contacts because each separated contact provides electrical connection from one terminal of one semiconductor die within a package to an external system. The terminals of a semiconductor die connected to separated contacts 102, 104, 106, or 108 are electrically separated from other terminals of another co-packaged semiconductor die. Common contacts 110 are referred to as common contacts because common contacts 110 electrically couple a terminal of one semiconductor die to a terminal of a co-packaged semiconductor die, in addition to electrically coupling both terminals of the co-packaged semiconductor die to a common external circuit node. Common contact 110 is common between two co-packaged semiconductor die. Common contact 110 provides a common connection on a PCB to two different semiconductor die. In one embodiment, common contact 110 is rectangular and includes a substantially uniform cross-sectional area between two semiconductor die mounted on leadframe 100. Common contact 110 does not include a conductive trace or other thinner portion connecting two contact portions, but rather is a single contact with a substantially uniform cross-section between two semiconductor die. Maintaining a relatively wide cross-section of contact 110 between two adjacent semiconductor die reduces electrical resistance between connected terminals of the two semiconductor die.

Figure 1C:
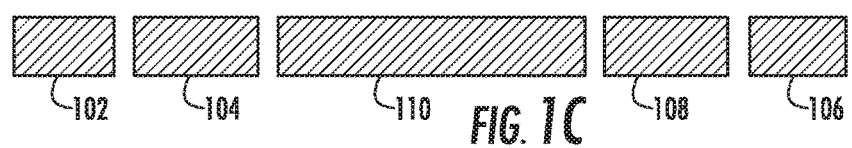

FIG. 1C illustrates a partial cross-section of one embodiment of a leadframe 100 through line 1C-1C in FIG. 1A. Common contact 110 is centrally located in leadframe 100 so that two terminals of two different semiconductor die are disposed adjacent to each other and are both directly over common contact 110. The adjacent terminals of the semiconductor die over common contact 110 are both disposed within a footprint of common contact 110 and include solder bumps, copper pillars, or other interconnect structures metallurgically bonded to common contact 110. The adjacent terminals of the semiconductor die are connected through common contact 110. Common contact 110 provides a relatively short and wide path for electrical current between terminals of two separate semiconductor die and a circuit node on a PCB to reduce electrical resistance. Separated contacts 102, 104, 106, and 108 provide electrical connections between the additional terminals of the semiconductor die and other circuit nodes on the PCB.

In the view illustrated in FIG. 1C, leadframe 100 includes separated contact 104 to the left of common contact 110, and separated contact 102 to the left of separated contact 104. Separated contact 108 is to the right of common contact 110, and separated contact 106 is to the right of separated contact 108. Contacts 102-110 are aligned linearly. In other embodiments, separated contacts 102-108 may be disposed surrounding common contact 110 with one separated contact 102-108 on each of four sides of common contact 110. In another embodiment, separated contacts 102-108 are arranged with separated contacts 102 and 106 on one side of common contact 110, and separated contacts 104 and 108 on the side of common contact 110 opposite separated contacts 102 and 106. Separated contact 102 is aligned opposite separated contact 104, and separated contact 108 is aligned opposite separated contact 106.

In other embodiments, other configurations of disposing separated contacts 102-108 around common contact 110 are used. A separated contact generally refers to a leadframe contact that couples a single terminal of a single transistor to a contact pad or other interconnect structure on a substrate or PCB. A common contact generally refers to a leadframe contact that couples one terminal of a first transistor to one terminal of a second transistor. A common contact also provides a connection to a substrate or PCB for the two interconnected terminals of the two transistors. In some embodiments, the common leadframe contact is larger than a separated contact to allow two different physical devices to be disposed over the common contact. In some embodiments, separated contacts used for connecting gate terminals of transistors are made smaller in size than the separated contacts used for drain or source terminals due to lower current required to be transferred through gate terminals.

Figure 2A:
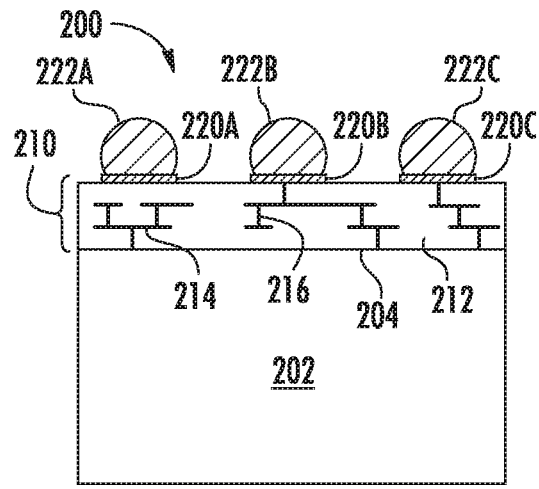
FIGS. 2A-2B illustrate individual MOSFETs mountable on a leadframe.
Figure 2B:
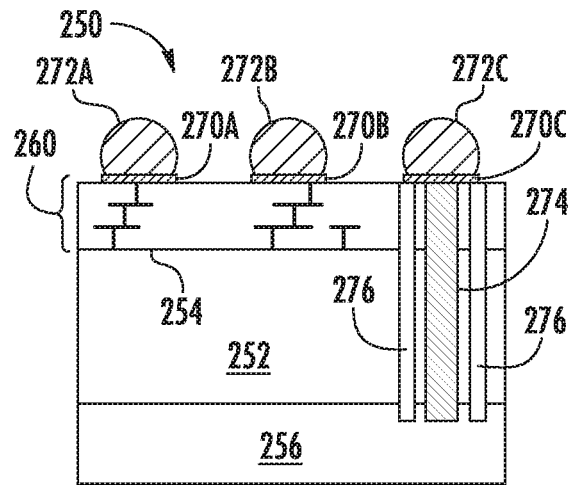

FIGS. 2A and 2B illustrate semiconductor die prepared to be flip-chip mounted to leadframe 100, leadframe 150, or another leadframe embodiment including separated contacts 102-108 and common contact 110. FIGS. 2A and 2B illustrate three-terminal devices. In other embodiments, a semiconductor die including only two terminals, e.g., a diode, is disposed over leadframe 100 and coupled to common contact 110. FIG. 2A illustrates one embodiment of a lateral MOSFET 200 including semiconductor die 202. While the present invention is discussed in terms of semiconductor die 202 including one or more MOSFET cells formed in active surface 204, other types of transistors are formed in other embodiments. Semiconductor die 202 may include a metal-semiconductor field-effect transistor (MESFET), junction gate field-effect transistor (JFET), BJT, or other type of transistor formed in active surface 204.

Semiconductor die 202 includes a base substrate material such as silicon, germanium, aluminum phosphide, aluminum arsenide, gallium arsenide, gallium nitride, indium phosphide, silicon carbide, or other similar material. One or more MOSFET cells is formed in active surface 204 by doping regions of semiconductor die 202 and forming conductive and insulating layers across active surface 204 as necessary to form gate, drain, and source terminals.

A build-up interconnect structure 210 is formed over semiconductor die 202. Build-up interconnect structure 210 is used to distribute electrical current from the gate, source, and drain terminals formed in active surface 204. A first insulating layer 212 is formed directly on active surface 204, and openings are formed through the first insulating layer 212 over drain, gate, and source terminals distributed across active surface 204. A first conductive layer 214 is formed over the first insulating layer 212 to horizontally distribute electric current. Portions of conductive layer 214 extend into the openings of insulating layer 212 as conductive vias 216 to contact underlying source, drain, and gate terminals. Conductive layers 214 and conductive vias 216 are formed to increase cross-sectional area, and thus reduce electrical resistance, because of high electrical currents commonly experienced in power MOSFET devices.

Additional insulating layers 212 and conductive layers 214 are successively formed over active surface 204 as required by the design of active surface 204 to couple source, drain, and gate terminals on active surface 204 while maintaining a relatively low electrical resistance through build-up interconnect structure 210. Each insulating layer 212 contains one or more layers of silicon dioxide (SiO2), silicon nitride (Si3N4), silicon oxynitride (SiON), tantalum pentoxide (Ta2O5), aluminum oxide (Al2O3), hafnium oxide (HfO2), benzocyclobutene (BCB), polyimide (PI), polybenzoxazoles (PBO), polymer, solder resist, or other material having similar structural and insulating properties. Each conductive layer 214 and conductive via 216 contains one or more layer of Al, Cu, Sn, Ni, Au, Ag, Ti, W, or other suitable electrically conductive material. Conductive layers 214 are formed using a patterning and metal deposition process such as printing, PVD, CVD, sputtering, electrolytic plating, or electroless plating.

After completion of build-up interconnect structure 210, contact pads 220 are formed over the final insulating layer 212. Contact pads 220 are formed in a similar manner to conductive layers 214. One contact pad 220 is formed for each terminal of the transistor formed in semiconductor die 202, e.g., contact pad 220A in FIG. 2A is a source contact, contact pad 220B is a drain contact, and contact pad 220C is a gate contact. In other embodiments, multiple contact pads are formed for one or more terminals of semiconductor die 202 to increase the area of conduction and reduce electrical resistance. Build-up interconnect structure 210 routes electric current from the terminals on active surface 204 to the appropriate contact pad 220 while maintaining a high cross-sectional area to reduce electrical resistance.

An electrically conductive bump material is deposited over contact pads 220 using an evaporation, electrolytic plating, electroless plating, ball drop, or screen printing process. The bump material is Al, Sn, Ni, Au, Ag, lead (Pb), bismuth (Bi), Cu, solder, or combinations thereof, with an optional flux solution. For example, the bump material is eutectic Sn/Pb, high-lead solder, or lead-free solder in some embodiments. The bump material is bonded to contact pads 220 using a suitable attachment or bonding process. The bump material is reflowed by heating the material above the material's melting point to form conductive bumps 222. In some applications, conductive bumps 222 are reflowed a second time to improve the electrical connection with contact pads 220. Conductive bumps 222 can also be compression bonded or thermocompression bonded to contact pads 220. Conductive bumps 222 represent one type of interconnect structure formed over contact pads 220 to provide a flip-chip connection to leadframe 100. The interconnect structure can also include a conductive column, stud bump, micro bump, or other electrical interconnect. In particular, FIG. 3F illustrates an embodiment which utilizes copper pillars as the interconnect structures formed over contact pads 220.

FIG. 2B illustrates one embodiment of a vertical MOSFET 250. A vertical MOSFET indicates that MOSFET cells formed in semiconductor die 252 are oriented vertically relative to active surface 254. Vertical MOSFETs generally include gate and source contacts at active surface 254, and a drain terminal 256 formed on the back side of semiconductor die 252 opposite active surface 254. Drain terminal 256 is a portion of semiconductor die 252 that is doped as necessary to create a drain terminal for vertical MOSFET cells formed in semiconductor die 252. Electric current through vertical MOSFET 250 when the MOSFET is turned on flows vertically through semiconductor die 252, from active surface 254 to drain terminal 256. By comparison, electric current through lateral MOSFET 200 primarily flows laterally across active surface 204.

Build-up interconnect structure 260 is formed over active surface 254 in a similar manner to build-up interconnect structure 210. Build-up interconnect structure 260 is designed to couple each MOSFET terminal on active surface 254, i.e, source and gate terminals, to contact pads 270 and bumps 272 formed over build-up interconnect structure 260. Because vertical MOSFET 250 includes a drain terminal 256 opposite active surface 254, rather than having a drain terminal on the active surface as with lateral MOSFET 200, conductive layers of build-up interconnect structure 260 do not couple drain terminal 256 to contact pad 270C and conductive bump 272C. Rather, an area of build-up interconnect structure 260 is formed free of conductive layers as a location for the formation of through-silicon via (TSV) 274.

A conductive via is a conductive structure that is formed in a substrate to provide electrical connection from one surface of the substrate to a structure on an opposite surface of the substrate. The term through-silicon via indicates that a conductive via is formed through a silicon substrate, semiconductor die, or semiconductor wafer. TSV 274 electrically connects drain terminal 256 to contact pad 270C and conductive bump 272C. TSV 274 allows vertical MOSFET 250 to be formed with a source, drain, and gate terminal all over active surface 254, even though semiconductor die 252 includes vertical MOSFET cells with drain terminal 256 formed opposite active surface 254. Isolating trench 276 is formed surrounding TSV 274 to electrically isolate the drain connection through semiconductor die 252. Isolation trench 276 operates to substantially block electric current from source contacts in active surface 254 and the base substrate material of semiconductor die 252 from flowing directly to TSV 274 without flowing through drain terminal 256.

TSV 274 and isolation trench 276 are formed by an etching process using a photoresist in one embodiment. First, a photoresist layer is deposited over build-up interconnect structure 260. An opening is formed in the photoresist layer over the locations that TSV 274 is desired by exposing the photoresist layer to UV light and developing the photoresist layer. An opening for TSV 274 is formed through build-up interconnect structure 260 and semiconductor die 252, and extending into the region of drain terminal 256, by deep reactive-ion etching, wet etching, dry etching, or another suitable etching process using the photoresist layer as a mask. In other embodiments, mechanical drilling or laser drilling is used to form the opening for TSV 274 through build-up interconnect structure 260 and semiconductor die 252 without the use of a masking layer. The opening is filled with an electrically conductive material to form TSV 274 using electrolytic plating, electroless plating process, or other suitable metal deposition process. TSV 274 can be one or more layers of Al, Cu, Sn, Ni, Au, Ag, Ti, W, poly-silicon, alloys thereof, or other suitable electrically conductive material.

An opening for isolation trench 276 is formed through build-up interconnect structure 260 and semiconductor die 252 in a similar manner. The opening for isolation trench 276 is subsequently filled with an electrically insulating material rather than the conductive material used in TSV 274. Insulating material for isolation trench 276 is deposited using PVD, CVD, printing, spin coating, spray coating, sintering, thermal oxidation, or another suitable process. Isolation trench 276 contains one or more layers of SiO2, Si3N4, SiON, Ta2O5, Al2O3, or other suitable dielectric material. Isolation trench 276 surrounds TSV 274 to electrically isolate TSV 274 from semiconductor die 252 other than the desired connection to drain terminal 256.

In some embodiments, a separate opening is not formed through semiconductor die 252 for isolation trench 276. Rather, a single opening for TSV 274 is formed. The single opening is conformally lined with an insulating material prior to depositing conductive material to form TSV 274. A plurality of TSVs 274 may be formed through semiconductor die 252 in embodiments where a plurality of drain contact pads 270C are used. In some embodiments, TSVs 274 are formed between each MOSFET cell in a multi-trench MOSFET. TSVs 274 extend from drain terminal 256 to active surface 254, and are electrically connected in parallel to conductive bump 272 by build-up interconnect structure 260.

Contact pads 270 and conductive bumps 272 are formed over build-up interconnect structure 260 and TSV 274 in a similar manner to contact pads 220 and conductive bumps 222. Conductive bumps 272 are configured to allow vertical MOSFET 250 to be flip-chip mounted to leadframe 100. Bumps 272 are spaced in a similar orientation as contacts 102, 104, and 110, so that bumps 272 are aligned with contacts 102, 104, and 110 or contacts 106, 108, and 110 when MOSFET 250 is positioned over leadframe 100. TSV 274 is formed in a location of semiconductor die 252 that depends on which contact of leadframe 100 is to be coupled to drain terminal 256 of the particular vertical MOSFET 250. TSV 274 is formed under contact pad 270C in FIG. 2B to align with common contact 110 when MOSFET 250 is flipped because the circuit design vertical MOSFET 250 is being used in has drain terminal 256 directly coupled to a terminal of another MOSFET. In other embodiments, TSV 274 is formed directly under contact pad 270A or 270B when drain terminal 256 will be coupled to a separated contact 102, 104, 106, or 108.

FIGS. 3A-3F illustrate various combinations of MOSFETs 200 and 250 from FIGS. 2A-2B paired and mounted over leadframe 100 from FIG. 1A. Different possible combinations of MOSFETs 200 and 250 are illustrated paired in each device formation area 101A-101D. In other embodiments, each device formation area 101 of a single leadframe 100 is formed using a similar pair of MOSFETs.

Figure 3A:
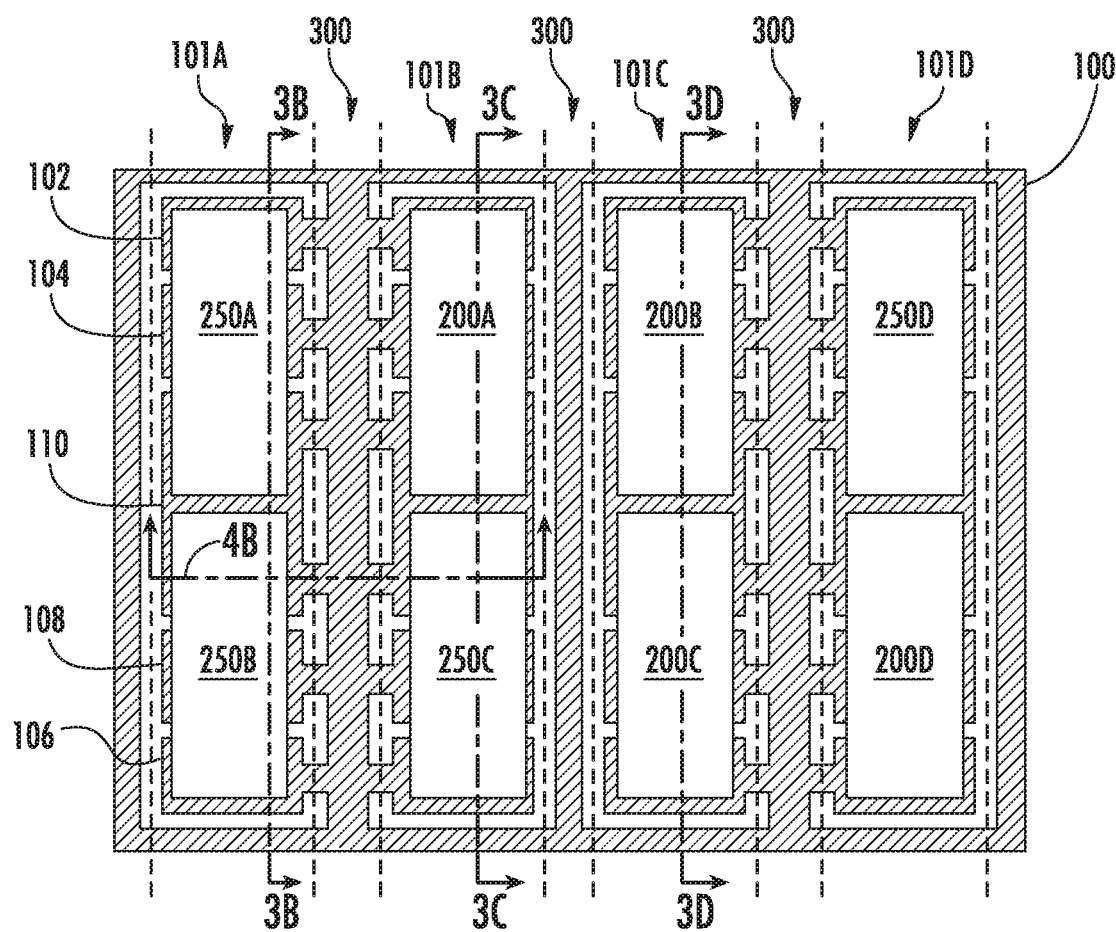
FIGS. 3A-3F illustrate individual MOSFETs mounted on the leadframe in a flip-chip on leadframe (FCOL) configuration.
Figure 4A:
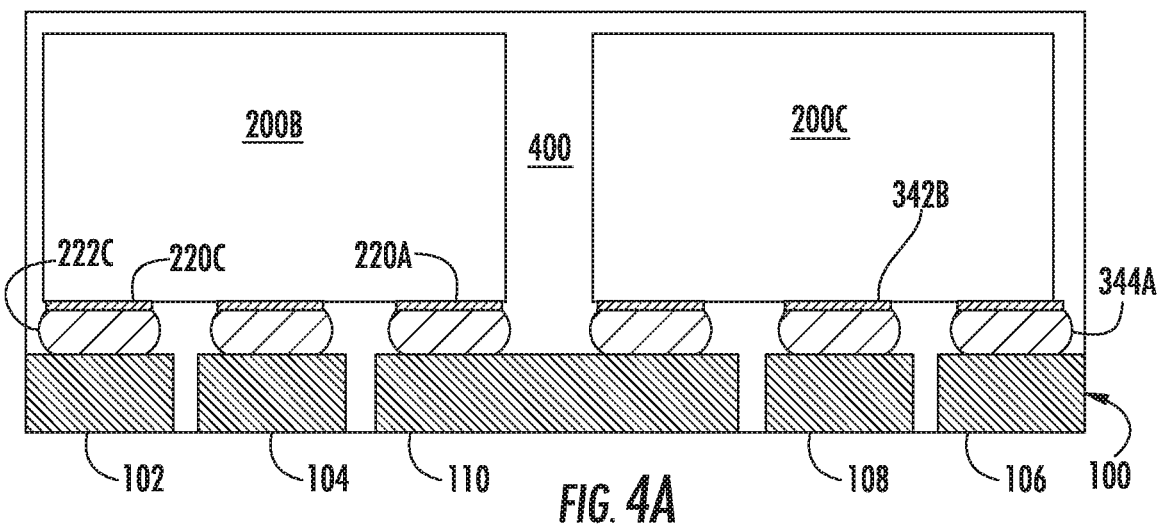
FIGS. 4A-4C illustrate completion of a FCOL paired MOSFET package.
Figure 4B:
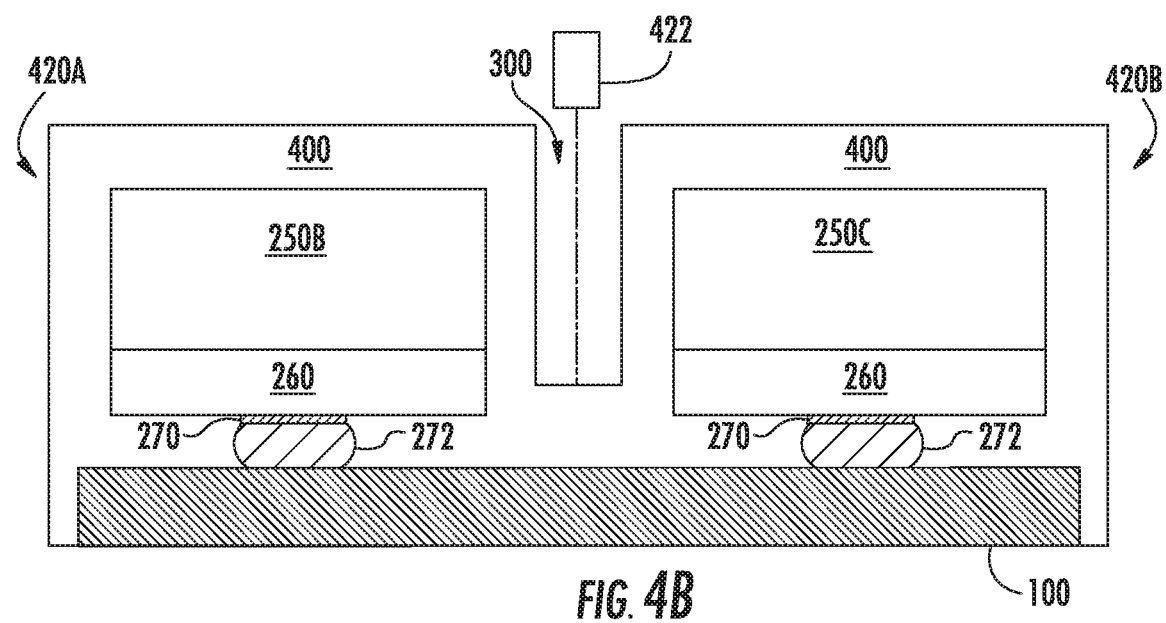
Figure 4C:
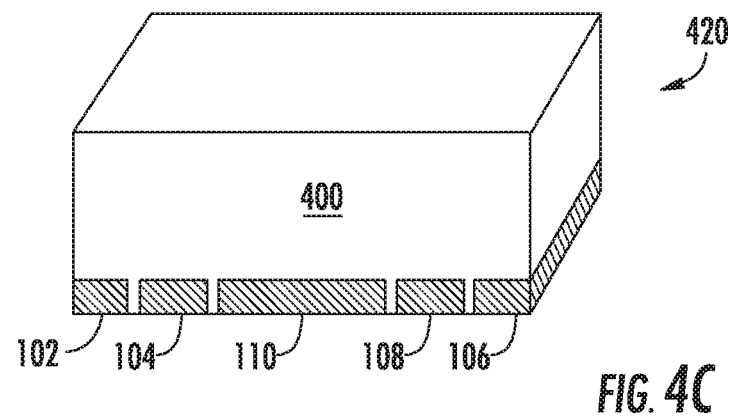

FIG. 3A illustrates a plurality of lateral MOSFETs 200 and vertical MOSFETs 250 paired in various combinations. Lateral MOSFETs 200 and vertical MOSFETs 250 are disposed over leadframe 100 using, e.g., a pick and place operation, with bumps 222 or 272 aligned with contacts 102-110. Bumps 222 and 272 are heated above a reflow temperature to electrically connect and mechanically bond bumps 222 and 272 to contacts 102-110. Vertical MOSFET 250A is paired with vertical MOSFET 250B on contacts 102-110 of device formation area 101A. Lateral MOSFET 200A is paired with vertical MOSFET 250C in device formation area 101B. Lateral MOSFET 200B is paired with lateral MOSFET 200C in device formation area 101C. Vertical MOSFET 250D is paired with lateral MOSFET 200D in device formation area 101D.

Each pair of MOSFETs in each device formation area 101 includes a common contact 110 coupling terminals between the two MOSFETs. Common contact 110 maintains a wide cross-sectional area between paired semiconductor die, e.g., MOSFETs 200A and 250C. A width of common contact 110 is wider than the widths of either of the paired semiconductor die, and the width of common contact 110 remains substantially uniform along the entire length of common contact 110. No conductive trace or other thinner portion of common contact 110 exists to connect MOSFET 200A to MOSFET 250C. Rather, common contact 110 is a single uniform contact extending under the footprints of both MOSFETs 200A and 250C.

Each of the semiconductor die disposed over leadframe 100 could be any type of three-terminal device desired for a specific embodiment. An N-channel FET is paired with a P-channel FET, or two N-channel FETs are paired. The specific terminal of each device that is coupled to common contact 110 may also be different depending on the embodiment. In some embodiments, the sources of two different FETs are coupled to each other by common contact 110, or the two FETs have drains coupled by common contact 110. In another embodiment, the drain of one FET is coupled to the source of another FET by common contact 110. In other embodiments, a two-terminal device, e.g., a diode, is paired with a transistor or other three-terminal device on leadframe 100.

Two different semiconductor die are disposed in each device formation area 101 and mounted to leadframe 100 by a flip-chip connection. Each semiconductor die includes a terminal directly over a common contact 110. Semiconductor die paired in a device formation area 101 each include terminals in close proximity and coupled together by common contact 110. Common contact 110 extends within footprints of two separate semiconductor die.

Figure 3B:
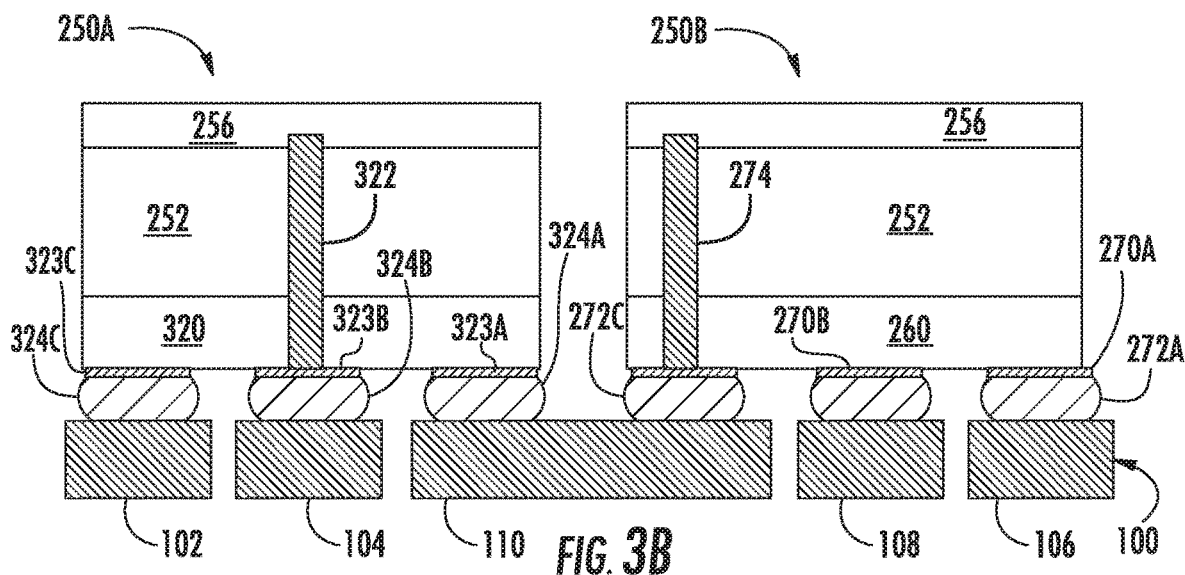

FIG. 3B illustrates vertical MOSFETs 250A and 250B from FIG. 3A disposed over leadframe 100 in device formation area 101A. Line 3B-3B in FIG. 3A illustrates where the cross-section of FIG. 3B is taken. Vertical MOSFET 250A includes a build-up interconnect structure 320. Build-up interconnect structure 320 is similar to build-up interconnect structure 260, but specifically configured to route electric current from source terminals on active surface 254 to conductive bump 324A, which is positioned over common contact 110. Build-up interconnect structure 320 routes gate terminals on active surface 254 to conductive bump 324C over separated contact 102. Build-up interconnect structure 320 is designed to route source and gate terminals to contact pads that can be positioned directly over the desired contacts of leadframe 100, while room is reserved directly over separated contact 104 for the formation of TSV 322 to couple conductive bump 324B to drain terminal 256. TSV 322 is formed in a similar manner to TSV 274. TSV 322 includes an insulating lining, or a separate insulation trench is formed surrounding TSV 322, to electrically isolate TSV 322 from the MOSFET formed in semiconductor die 252. A FET device formed in semiconductor die 252 includes gate terminals coupled to separated contact 102 through conductive bump 324C, source terminals coupled to separate contact 104 through conductive bump 324B, and drain terminal 256 coupled to separated contact 104 through TSV 322 and conductive bump 324B.

TSV 322 of vertical MOSFET 250A extends through build-up interconnect structure 320 and semiconductor die 252 to couple drain terminal 256 to separated contact 104. TSV 322 is directly over separated contact 104 and connects drain terminal 256 to contact pad 323B directly over separated contact 104. Separated contact 104 is coupled to TSV 274 by conductive bump 324B, which serves as a drain contact for vertical MOSFET 250A. Separated contact 102 operates as the gate contact of vertical MOSFET 250A. Common contact 110 operates as the source contact of MOSFET 250A, and couples source terminals of MOSFET 250A to drain terminal 256 of MOSFET 250B.

Vertical MOSFET 250B includes build-up interconnect structure 260, which is configured similarly to MOSFET 250 in FIG. 2B. Build-up interconnect structure 260 couples gate terminals on active surface 254 of semiconductor die 252 to separated contact 106 through conductive bump 272A. Separated contact 106 serves as the gate contact for vertical MOSFET 250B. Build-up interconnect structure 260 of vertical MOSFET 250B also couples source terminals on active surface 254 of vertical MOSFET 250B to separated contact 108. Separated contact 108 serves as the source contact for vertical MOSFET 292. Drain terminal 256 of vertical MOSFET 250B is coupled to common contact 110 by conductive via 274, contact pad 270C, and conductive bump 272C. Common contact 110 operates as the drain contact for MOSFET 250B, and couples drain terminal 256 of MOSFET 250B to source terminals of MOSFET 250A.

Common contact 110 of leadframe 100 serves as both the source contact of vertical MOSFET 250A and the drain contact for vertical MOSFET 250B. TSV 274 of vertical MOSFET 250B is positioned so that TSV 274 is directly over, or within a footprint of, common contact 110 when vertical MOSFET 250B is flipped and mounted over leadframe 100. Conductive bump 272C and contact pad 270C connect TSV 274 to common contact 110. Vertical MOSFETs 250A and 250B each include one terminal disposed directly over and mounted to common contact 110. Vertical MOSFET 250A includes a source terminal in conductive bump 324A disposed over common contact 110. Vertical MOSFET 250B includes a drain terminal in conductive bump 272C disposed over common contact 110. Conductive bump 324A of vertical MOSFET 250A and conductive bump 272C of vertical MOSFET 250B are disposed in close proximity to each other and connected by common contact 110.

Common contact 110 is exposed in the final package to be mounted to a PCB and connected to a circuit node that is common to both MOSFET 250A and MOSFET 250B in the circuit design. MOSFETs 250A and 250B could be an N-channel device paired with a P-channel device, or both MOSFETs 250A and 250B could be P-channel or N-channel devices. In other embodiments, MOSFET 250A has drain terminal 256 coupled to common contact 110 rather than source terminals, and MOSFET 250B may have source terminals coupled to common contact 110 rather than drain terminal 256. TSVs 274 and 322 are used because semiconductor die 252 include vertical FET structures with transistor terminals on two opposite faces of semiconductor die 252. TSVs 274 and 322 electrically couple transistor terminals on the back side of semiconductor die 252 to an interconnect structure over active surface 254 to provide a simple flip-chip connection between semiconductor die 252 and leadframe 100.

Figure 3C:
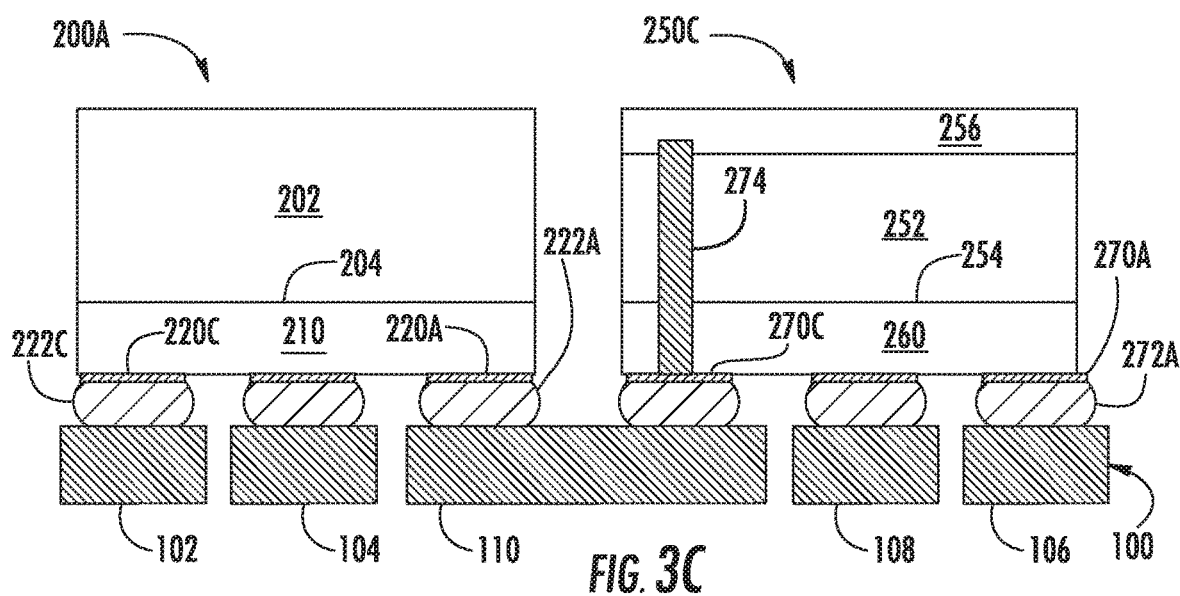

FIG. 3C illustrates lateral MOSFET 200A paired with vertical MOSFET 250C in device formation area 101B of leadframe 100. Line 3C-3C in FIG. 3A illustrates where the cross-section of FIG. 3C is taken. Vertical MOSFET 250C is similar to vertical MOSFET 250B in FIG. 3B, with gate terminals on active surface 254 coupled to separated contact 106, source terminals on active surface 254 coupled to separated contact 108, and drain terminal 256 coupled to common contact 110 by TSV 274.

Build-up interconnect structure 210 of lateral MOSFET 200A routes electrical current from gate terminals on active surface 204 to separated contact 102 through contact pad 220C and conductive bump 222C. Build-up interconnect structure 210 routes electrical current from drain terminals on active surface 204 to separated contact 104 through contact pad 220B and conductive bump 222B. Build-up interconnect structure 210 routes electrical current from source terminals on active surface 204 to common contact 110 through contact pad 220A and conductive bump 222A. Build-up interconnect structure 210 routes electrical current to three contact pads, each of which is positioned directly over a contact of leadframe 100 when lateral MOSFET 200A is positioned over and mounted to leadframe 100.

Common contact 110 couples source terminals of lateral MOSFET 200A to drain terminal 256 of vertical MOSFET 250C. Build-up interconnect structure 210, build-up interconnect structure 260, and TSV 274 are designed to route electric current from any desired MOSFET terminals to a conductive bump positioned directly over common contact 110 depending on the ultimate circuit design. Common contact 110 couples the MOSFET terminals to each other, and to a circuit node on a PCB or other substrate.

Figure 3D:
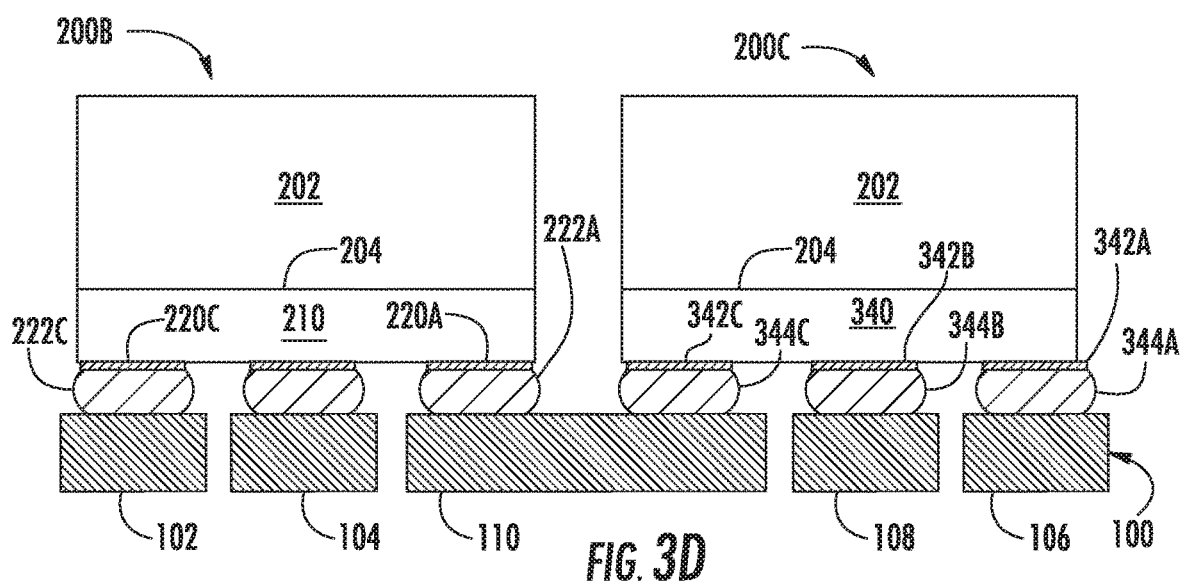

FIG. 3D illustrates two lateral MOSFETs 200B and 200C disposed in device formation area 101C of leadframe 100. Line 3D-3D in FIG. 3A illustrates where the cross-section of FIG. 3D is taken. Lateral MOSFET 200B is similar to lateral MOSFET 200A, and connected to contacts 102, 104, and 110 in a similar configuration. Lateral MOSFET 200C includes build-up interconnect structure 340 which connects contact pads 342 to MOSFET terminals of active surface 204 in a different orientation than build-up interconnect structure 210. While lateral MOSFETs 200B and 200C may include similar semiconductor die 202 with similar FETs, build-up interconnect structures 210 and 340 are formed differently to allow for different terminals coupled to common contact 110. Build-up interconnect structure 340 couples drain terminals on active surface 204 of lateral MOSFET 200C to common contact 110 through contact pad 342C and conductive bump 344C. Build-up interconnect structure 340 couples source terminals on active surface 204 of lateral MOSFET 200C to separated contact 108 through contact pad 342B and conductive bump 344B. Build-up interconnect structure 340 couples gate terminals on active surface 204 of lateral MOSFET 200C to separated contact 106 through contact pad 342A and conductive bump 344A.

Figure 3E:
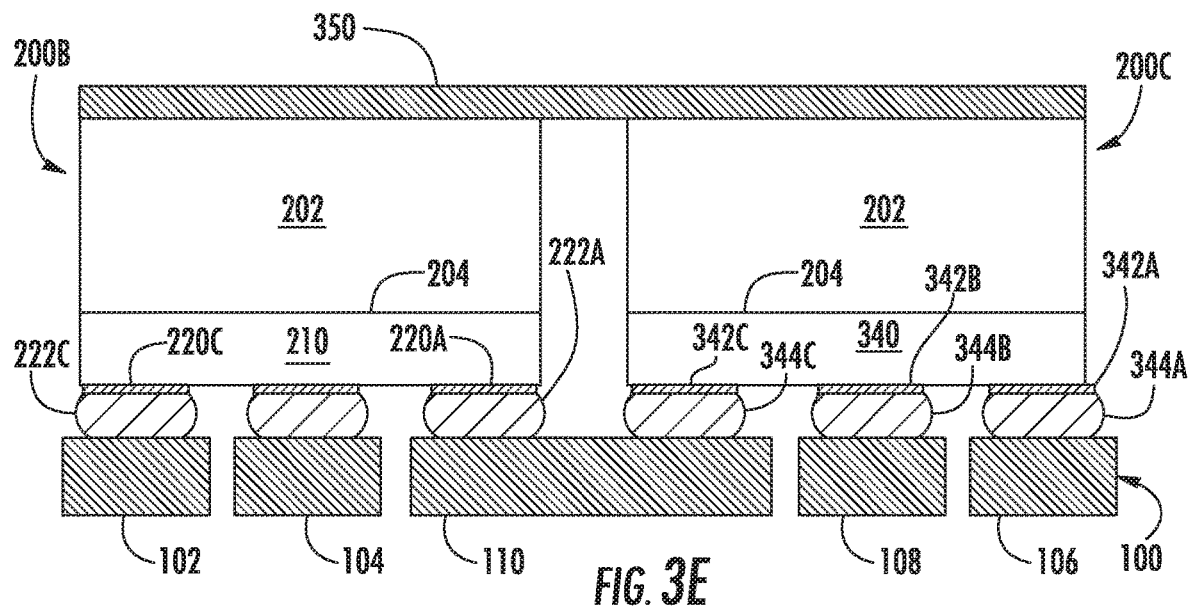
Figure 3F:
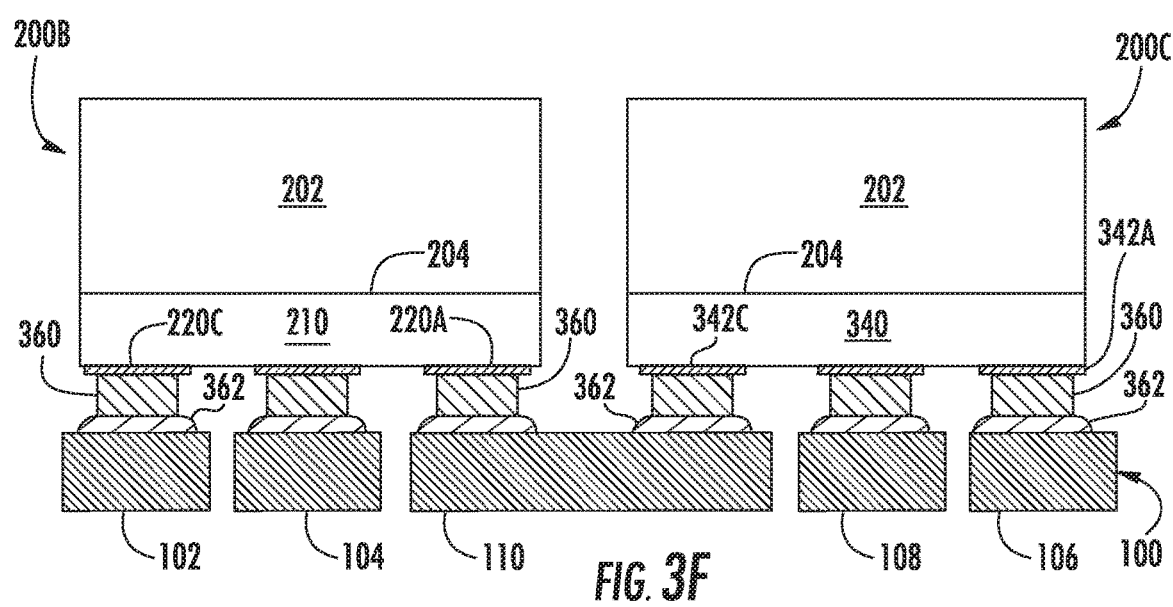

FIG. 3E illustrates lateral MOSFETs 200B and 200C with an optional heat spreader 350 mounted over lateral MOSFETs 200B and 200C. Heat spreader 350 absorbs heat generated by electric current through lateral MOSFETs 200B and 200C and transfers the heat to an external heatsink. In some embodiments, an electrically insulating thermal interface material is provided between heat spreader 350 and semiconductor die 202 to electrically isolate lateral MOSFET 200B, lateral MOSFET 200C, and heat spreader 350.

FIG. 3F illustrates lateral MOSFETs 200B and 200C mounted to leadframe 100 using conductive pillars 360 rather than conductive bumps 222 and 344. Conductive pillars 360 are formed by disposing a photoresist over build-up interconnect structures 210 and 340. Openings are formed through the photoresist over contact pads 220 and 342. An electrically conductive material is deposited in the openings to form conductive pillars 360. In one embodiment, the conductive material used to form conductive pillars 360 is copper or a copper alloy. In other embodiments, other appropriate conductive materials are used. In some embodiments, a seed layer of Ti/Cu, Titanium Tungsten (TiW)/Cu, or a coupling agent/Cu is formed over build-up interconnect structures 210 and 340 prior to depositing the photoresist. The seed layer is deposited by sputtering, electroless plating, or by depositing laminated Cu foil combined with electroless plating.

Solder paste 362 is disposed over conductive pillars 360 using the same photoresist mask used to form conductive pillars 360. In other embodiments, solder paste 362 is printed onto leadframe 100 prior to disposing lateral MOSFETs 200B and 200C over leadframe 100. The photoresist is removed after formation of conductive pillars 360 to leave conductive pillars 360 extending over build-up interconnect structures 210 and 340. Exposed portions of the seed layer are etched away. After disposing lateral MOSFETs 200B and 200C over leadframe 100, solder paste 362 is reflowed to electrically and mechanically connect lateral MOSFETs 200B and 200C to leadframe 100. Conductive pillars 360 are compatible with lateral MOSFET 200, vertical MOSFET 250, and other types of transistors mounted to leadframe 100.

In FIG. 4A, an encapsulant 400 is deposited over leadframe 100, lateral MOSFETs 200A-200D, and vertical MOSFETs 250A-250D. FIG. 4A illustrates the same cross-section of FIG. 2A, through device formation area 101C, as is seen in FIGS. 3D-3F. Encapsulant 400 is deposited using a paste printing, compressive molding, transfer molding, liquid encapsulant molding, vacuum lamination, spin coating, mold underfill, or other suitable application process. Encapsulant 400 is a polymer composite material, such as epoxy resin with filler, epoxy acrylate with filler, or polymer with proper filler. Encapsulant 400 is non-conductive and environmentally protects MOSFETs 200A-200D and 250A-250D from external elements and contaminants.

In some embodiments, encapsulant 400 is deposited covering heat spreader 350, and a backgrinding operation is performed to reduce a thickness of encapsulant 400 and expose heat spreader 350. In other embodiments, a portion of encapsulant 400 is removed using mechanical polishing, chemical-mechanical planarization, a photoresist and a chemical etchant, reactive-ion etching, laser direct ablation (LDA), or other suitable etching or planarization process if necessary to expose contacts 102-110 for subsequent connection to a PCB or substrate. Encapsulant 400 is deposited over and around MOSFETs 200B and 200C. Encapsulant 400 also blankets lateral MOSFETs 200A and 200D and vertical MOSFETs 250A-250D. Encapsulant 400 surrounds each contact 102-110 of leadframe 100 while leaving contacts 102-110 exposed for subsequent electrical interconnection to a PCB or other substrate. In embodiments with leads that extend from a final package, e.g., using leadframe 150, the mold used to deposit encapsulant 400 prevents leads 162 from being completely encapsulated. Leads 162 extend from encapsulant 400 in the final package as leads.

In FIG. 4B, leadframe 100 and encapsulant 400 are singulated through saw streets 300 using a saw blade or laser cutting tool 422 to separate device formation areas 101A-101D and create individual paired MOSFET packages 420. FIG. 4B illustrates a partial cross-section of leadframe 100 through line 4B in FIG. 2A. FIG. 4B illustrates leadframe 100 in the process of being singulated between vertical MOSFET 250B and vertical MOSFET 250C. Laser cutting tool 422 cuts through frame 114 and connecting portions 112 of leadframe 100 to form paired MOSFET packages 420A and 420B. In some embodiments, the width of saw street 300 includes portions of contacts 102-110. When leadframe 100 is singulated, portions of contacts 102-110 are removed along with encapsulant 400 to ensure that contacts 102-110 are exposed at side surfaces of each paired MOSFET package 420.

Once laser cutting tool 422 cuts completely through encapsulant 400 and leadframe 100, each device formation area 101A-101D becomes a separate unit as illustrated by paired MOSFET package 420 in FIG. 4C. Encapsulant 400 covers the semiconductor die mounted to leadframe 100, so the semiconductor die are not externally visible. Contacts 102-110 include side surfaces and bottom surfaces approximately coplanar with surfaces of encapsulant 400. Contacts 102-110 are exposed from encapsulant 400 for subsequent electrical interconnection to a PCB or other substrate.

Each paired MOSFET package 420 includes two discrete MOSFET devices selected for a specific application. The MOSFET devices are paired and terminals of the paired MOSFET devices are coupled to each other by common contact 110. Common contact 110 provides a wide electrical path with a uniform cross-section between paired MOSFET devices. The MOSFET devices selected vary depending on the application. Either MOSFET may be an N-channel or P-channel MOSFET. Either MOSFET may be a lateral or vertical device. Other transistor types besides MOSFETs, e.g., MOSFETs, JFETs, or BJTs are mounted on leadframe 100 in other embodiments. In some embodiments, paired MOSFET devices will have different current loads by design. The MOSFET device with the lighter load may be reduced in size and the MOSFET device with the larger load may be increased in size. TSVs are used in vertical MOSFETs that include connections on two different surfaces to provide drain, gate, and source connections to leadframe 100 at a single surface of the MOSFET devices. Having each terminal of a MOSFET device on a single surface allows a simple flip-chip connection between the MOSFET device and leadframe 100. The flip-chip on leadframe configuration allows a terminal of one semiconductor die to be disposed in close proximity to a terminal of a second semiconductor die for connection to each other by common contact 110.

Build-up interconnect structures, e.g., build-up interconnect structures 210, 260, 320, and 340 are used to map the gate, drain, and source terminals of individual semiconductor die to conductive bumps or pillars that are flip-chip bonded to leadframe 100. Build-up interconnect structures are customized to the specific leadframe 100 being used and the desired pinout of the final package. The build-up interconnect structures are configured to ensure that contacts for terminals to be connected between semiconductor die are positioned over common contact 110. For common switch-mode power supply or class D amplifier topologies, a source terminal of a high-side MOSFET is coupled to a drain terminal of a low-side MOSFET by common contact 110. In some embodiments, two MOSFETs have their source terminals connected together by common contact 110. In other embodiments, two MOSFETs have their drain terminals connected together by common contact 110.

Co-packaging MOSFETs, or other transistors, in paired MOSFET package 420 using flip-chip on leadframe (FCOL) technology allows close spacing of adjacent die on a common leadframe without requiring an interconnect structure external to vertical MOSFETs to couple contacts on the opposite surface, thus reducing package size. MOSFET devices are attached to leadframe 100 using ball grid array, land-grid array, copper pillars, or similar interconnect structures using a flip-chip attachment. A reduction in interconnect resistance and inductance results in more efficient switching and conduction operation.

Figure 5A:
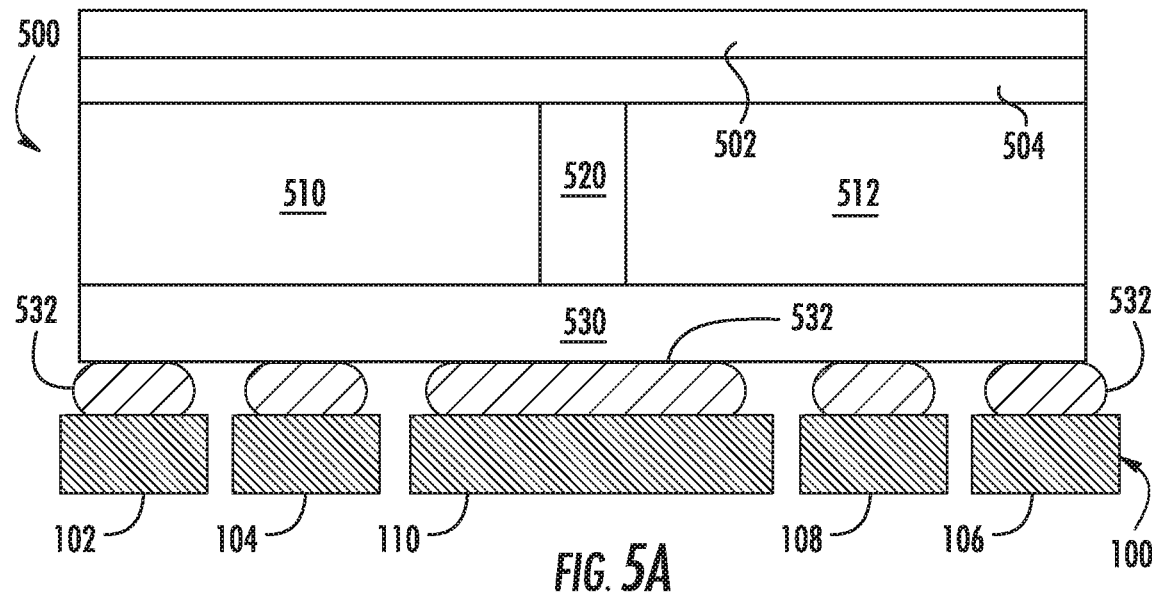
FIGS. 5A-5B illustrate FCOL embodiments with monolithically integrated paired MOSFETs on a leadframe with a common contact.

FIG. 5A illustrates forming paired MOSFETs monolithically integrated in semiconductor die 500. Semiconductor die 500 is a silicon-on-insulator die including substrate 502 and insulating layer 504 in one embodiment. Two separate MOSFET devices 510 and 512 are formed in die 500 over substrate 502 and insulating layer 504. An isolation trench 520 is formed between MOSFET 510 and 512 to isolate the voltage potentials of the MOSFET bodies. Isolation trench 520 is formed using a photoresist as a mask and performing an etching process to create an opening into semiconductor die 500 that extends to insulating layer 504. The opening is filled with one or more layers of SiO2, Si3N4, SiON, Ta2O5, Al2O3, HfO2, PI, BCB, PBO, or other suitable dielectric material to create isolation trench 520.

Build-up interconnect structure 530 is formed over semiconductor die 500 to route the individual MOSFET terminals of MOSFETs 510 and 512 to the desired contacts of leadframe 100. Metal layers of build-up interconnect structure 530 connect source terminals of MOSFET 510 to drain terminals of MOSFET 512, which reduces electrical resistance even further compared to connecting the MOSFETs through common contact 110 only. Different MOSFET terminals are connected to each other by common contact 110 in other embodiments. Conductive bumps 532 are formed over contact pads of build-up interconnect structure 530 in a similar manner to conductive bumps 222 and 272. Semiconductor die 500 is disposed over leadframe 100 with conductive bumps 532 over contacts 102-110. Bumps 532 are heated above a reflow temperature to electrically and mechanically couple semiconductor die 500 to leadframe 100. Semiconductor die 500 and leadframe 100 are encapsulated and singulated as illustrated in FIGS. 4A-4B.

As when using two MOSFETs formed in separate semiconductor die, MOSFETs 510 and 512 are different types of MOSFETs in different embodiments. A vertical MOSFET and a lateral MOSFET are monolithically integrated onto semiconductor die 500 in one embodiment. In another embodiment, semiconductor die 500 includes an N-channel MOSFET paired with a P-channel MOSFET. Other transistors besides MOSFETs are formed in semiconductor die 500 in other embodiments, e.g., MOSFETs, JFETs, or BJTs.

Figure 5B:
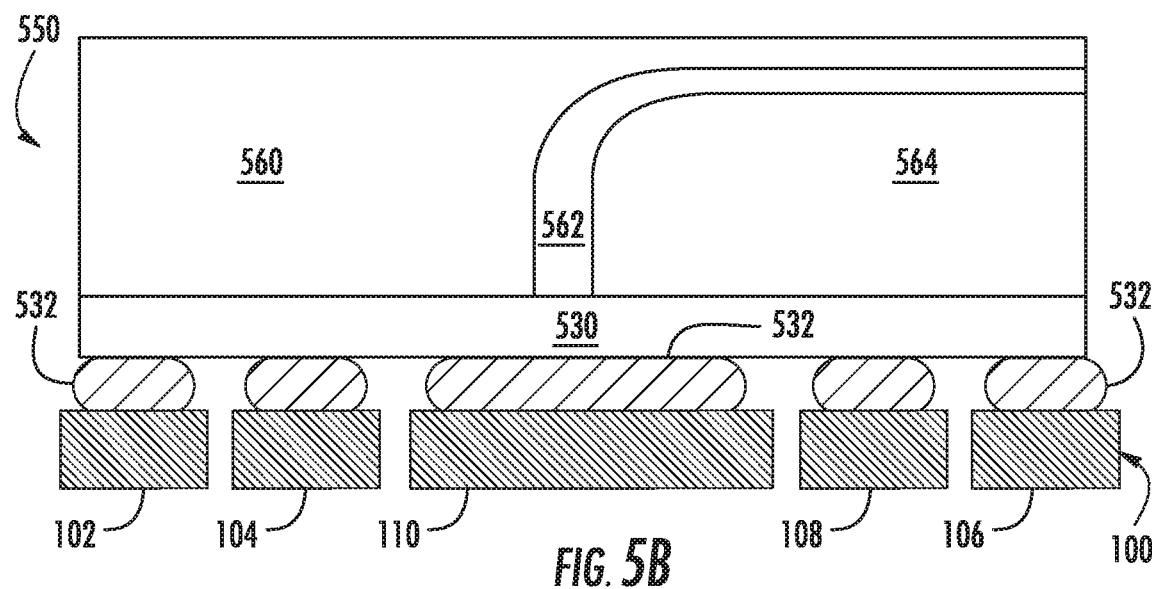

FIG. 5B illustrates MOSFET 560 and 564 monolithically integrated on semiconductor die 550 using doped well 562 for isolation rather than isolation trench 520. MOSFET 560 is formed in base substrate material of semiconductor die 550. A doped well 562 is formed in semiconductor die 550. Doped well 562 is large enough that MOSFET 564 is formed completely within doped well 562, and doped well 562 surrounds MOSFET 564. Doped well 562 is doped with an opposite dopant type as the base substrate material of MOSFETs 560 and 564 that contacts doped well 562. MOSFET 564 is electrically isolated from MOSFET 560 by depletion regions that form where doped well 562 contacts the base substrate material of MOSFET 560 and MOSFET 564.

MOSFETs 560 and 564 are similar to MOSFETs 510 and 512 in FIG. 5A. Build-up interconnect structure 530 distributes terminals of MOSFETs 560 and 564 to conductive bumps 532, which couple MOSFETs 560 and 564 to leadframe 100. A terminal of MOSFET 560 is coupled to a terminal of MOSFET 564 by build-up interconnect structure 530, conductive bump 532, and common contact 110 in parallel.

Monolithic integration of MOSFETs on a common semiconductor die 500 or 550 allows further reduction in spacing between MOSFETs, further reducing package size and assembly complexity during manufacturing. Semiconductor die 500 and 550 are attached to leadframe 100 using ball-grid array, land-grid array, copper pillars, or a similar flip-chip attachment technique.

Figure 6A:
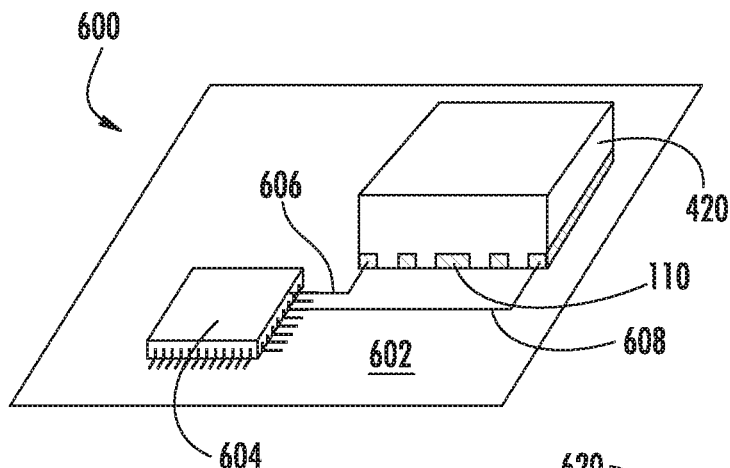
FIGS. 6A-6C illustrate applications of a paired MOSFET package.

FIG. 6A illustrates an electronic device 600 with paired MOSFET package 420 surface mounted on PCB 602. Controller 604 mounted to PCB 602 adjacent paired MOSFET package 420 and coupled to separated contacts 102 and 106 of leadframe 100 by conductive traces 606 and 608, respectively. Separated contacts 102 and 106 couple the outputs of controller 604 to gate terminals of MOSFETs within paired MOSFET package 420. Additional conductive traces connect common contact 110 and separated contacts 104 and 108 to circuit nodes on PCB 602 determined by the circuit design implemented on PCB 602.

Figure 6B:
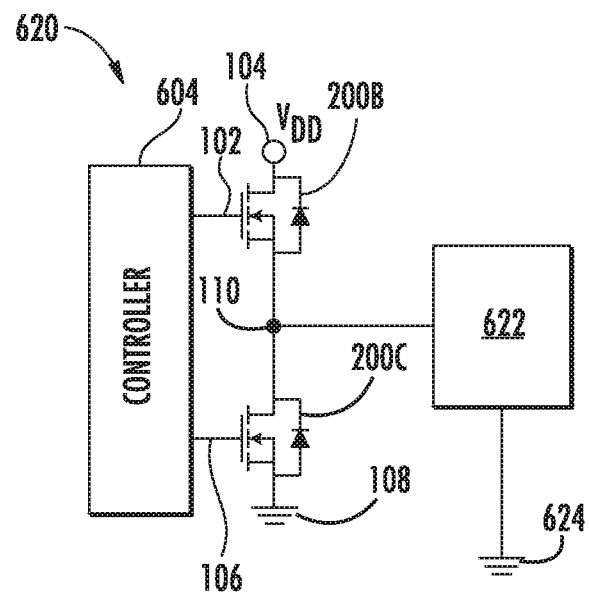
Figure 6C:
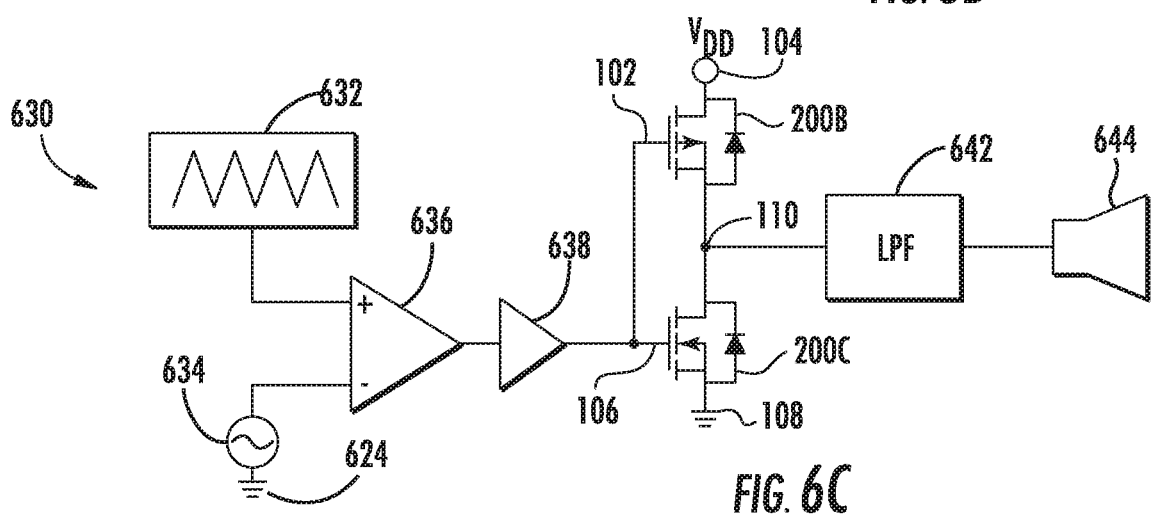

FIGS. 6B and 6C illustrate two exemplary but non-limiting circuit diagrams of electronic devices that include paired MOSFETs with terminals of each MOSFET electrically coupled through common contact 110 of leadframe 100. FIG. 6B illustrates a switch-mode power supply (SMPS) 620 which can be formed on PCB 602 of FIG. 6A. Controller 604 is configured to control a power signal by turning MOSFET 200B and MOSFET 200C on and off alternatively. For use in SMPS 620, MOSFETs 200B and 200C are power MOSFETs specifically designed to switch relatively large electrical currents. A load 622 is coupled between common contact 110 and ground node 624. Load 622 is powered by the electrical signal at common contact 110.

Controller 604 is coupled to the gate of MOSFET 200B through separated contact 102 and the gate of MOSFET 200C through separated contact 106. In some embodiments, additional driver circuitry is coupled between controller 604 and separated contacts 102 and 106. The drain of MOSFET 200B is coupled to a positive $V_{DD}$ voltage at separated contact 104. The source of MOSFET 200C is coupled to a ground voltage potential at separated contact 108. The drain terminal of MOSFET 200C is coupled to the source contact of MOSFET 200B by common contact 110. Load 622 is coupled to both MOSFETs 200B and 200C through common contact 110 by a trace on PCB 602. MOSFET 200B is referred to as the high-side MOSFET because MOSFET 200B connects the circuit node at common contact 110 to a positive $V_{DD}$ voltage potential when MOSFET 200B is on. MOSFET 200C is referred to as the low-side MOSFET because MOSFET 200C connects the circuit node at common contact 110 to a low or ground voltage potential when MOSFET 200C is turned on.

Controller 604 switches MOSFET 200B and MOSFET 200C on alternatively. When MOSFET 200B is on and MOSFET 200C is off, common contact 110 is coupled to the $V_{DD}$ voltage at separated contact 104 through MOSFET 200B. When MOSFET 200B is off and MOSFET 200C is on, common contact 110 is coupled to a ground voltage potential at separated contact 108 through MOSFET 200C. Circuit block 622 represents an electric load coupled between common contact 110 and ground node 624 that is powered by SMPS 620. Circuit block 622 also represents a resonant circuit, power transformer, and other circuitry used to convert the electric pulses provided at common contact 110 into a steady direct current voltage, if used.

SMPS 620 uses any power supply topology that includes a pair of MOSFETs to switch a circuit node between two different voltage potentials. In various embodiments, SMPS 620 includes, but is not limited to, a buck converter, an LLC resonant mode converter, a flyback converter, a forward converter, a push-pull converter, or a half-bridge converter.

In some SMPS 620 topologies, a vertical MOSFET 250 is used as the low-side MOSFET paired with a lateral high-side MOSFET 200. If the high-side MOSFET has a relatively low duty cycle, then most of the power losses in the high-side MOSFET are from switching losses rather than conduction losses. A lateral high-side MOSFET 200 is manufactured with low gate charge to be switched efficiently, while RDSON is not as important. If the low-side MOSFET has a relatively high duty cycle, the largest portion of losses in the low-side MOSFET are conduction losses. A vertical low-side MOSFET 250 is manufactured to reduce RDSON and reverse recovery losses.

Another common application for paired MOSFETs is in class D audio amplifiers. A class D amplifier 630 is illustrated in FIG. 6C. A triangle wave generator 632 and an analog audio input signal 634 are provided. Comparator 636 compares a triangle wave signal from triangle wave generator 632 against analog audio input signal 634 to create a series of output pulses having a duty cycle proportional with the instantaneous value of analog audio input signal 634. Driver circuit 638 conditions the voltage pulses from comparator 636 as necessary to drive MOSFETs 200B and 200C. Switching MOSFETs in class D amplifier 630 are of opposite channel conductivity types. MOSFET 200C is an N-channel MOSFET as in FIG. 6B, while MOSFET 200B is a P-channel device.

Having devices of opposite channel types allows a single signal to operate the gates of both MOSFET 200C and MOSFET 200B. When the gate inputs of MOSFETs 200C and 200B are coupled to a logic zero value, or ground voltage potential, the P-channel MOSFET 200B is on and couples common contact 110 to the $V_{DD}$ voltage potential applied to separated contact 104, while MOSFET 200C remains off. When the gate inputs of MOSFETs 200C and 200B are coupled to a logic one value, or a sufficiently positive voltage potential, common contact 110 is coupled to the ground voltage potential connected at separated contact 108 through N-channel MOSFET 200C while P-channel MOSFET 200B remains off. Switching of MOSFETs 200C and 200B creates an amplified version of the pulses output by comparator 636, which is observed at common contact 110. Low pass filter 642 smooths the amplified pulses into an amplified version of the original analog audio input signal 634, which is audibly output by speaker 644.

Paired MOSFETs are used in other common circuits. Rectifiers, motor drivers, ultrasonic drivers, and back-to-back battery switches are just some of the many circuits that utilize paired MOSFETs. Paired MOSFET package 420 with two MOSFETs electrically coupled by common contact 110 of leadframe 100 internal to the packaging reduces interconnect resistance and inductance, and results in more efficient switching and conduction operation.

Terms of relative position as used in this description are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

While one or more embodiments of the present invention have been illustrated in detail, the skilled artisan will appreciate that modifications and adaptations to those embodiments may be made without departing from the scope of the present invention as set forth in the following claims.

The invention claimed is:

1. A method of making a semiconductor device, comprising:
   providing a leadframe including a common contact;
   providing a first transistor including a first interconnect structure formed over an active surface of the first transistor;
   providing a second transistor including a second interconnect structure formed over an active surface of the second transistor;
   disposing the first transistor over the leadframe with the first interconnect structure on the common contact; and
   disposing the second transistor over the leadframe with second interconnect structure on the common contact,
   wherein a source terminal of the first transistor is electrically coupled to the common contact, and a drain terminal of the second transistor is electrically coupled to the common contact, and
   wherein one or both of the source terminal of the first transistor and the drain terminal of the second transistor are formed on the active surfaces of the first transistor and the second transistor, respectively, and
   wherein the one or both of the source terminal of the first transistor and the drain terminal of the second transistor are electrically coupled to the common contact via the first interconnect structure and the second interconnect structure, respectively.

2. The method of claim 1, further including:
   disposing the first transistor within a footprint of the common contact; and
   disposing the second transistor within the footprint of the common contact.

3. The method of claim 2, wherein providing the first transistor with the first interconnect structure includes separately forming a first source contact pad, a first drain contact pad and a first gate contact pad and wherein providing the second transistor with the second interconnect structure includes separately forming a second source contact pad, a second drain contact pad and a second gate contact pad.

4. The method of claim 3, wherein disposing the first transistor within the footprint of the common contact includes disposing the first source contact pad within the footprint of the common contact while not disposing the first drain contact pad and the first gate contact pad within the footprint of the common contact, and wherein disposing the second transistor within the footprint of the common contact includes disposing the second drain contact pad within the footprint of the common contact while not disposing the second source contact pad and the second gate contact pad within the footprint of the common contact.

5. The method of claim 1, wherein the first transistor includes a lateral power MOSFET, and the second transistor includes a vertical power MOSFET.

6. The method of claim 5, further including forming a through-silicon via in the second transistor that electrically couples the drain terminal of the vertical power MOSFET to the common contact.

7. The method of claim 6, wherein the first interconnect structure electrically couples the source terminal of the lateral MOSFET to the common contact.

8. The method of claim 1, further including mounting the first transistor and second transistor to the leadframe with a flip-chip connection, wherein the first interconnect structure and second interconnect structure include copper pillars or solder bumps.

9. The method of claim 1, further including forming the common contact of the leadframe to include a substantially uniform cross-section between the first interconnect structure and second interconnect structure.

10. The method of claim 1, further including depositing an encapsulant over the leadframe, first transistor, and second transistor.

11. The method of claim 1, wherein the common contact includes a substantially uniform width between the first transistor and second transistor.

12. The method of claim 1, further comprising monolithically integrating the first and second transistors on a single semiconductor die.

13. The method of claim 12, further including forming an isolation well between the first transistor and second transistor.

14. The method of claim 1, wherein providing the leadframe further includes providing a first separated contact that is electrically isolated from the common contact, and wherein the first interconnect structure electrically connects a drain terminal on the active surface of the first transistor to the first separated contact.

15. The method of claim 14, wherein providing the leadframe further includes providing a second separated contact that is electrically isolated from the common contact, and wherein the second interconnect structure electrically connects a source terminal on the active surface of the second transistor to the second separated contact.

16. The method of claim 15, wherein providing the leadframe further includes providing a third and fourth separated contacts that are electrically isolated from the common contact, and wherein the first interconnect structure electrically connects a gate terminal on the active surface of the first transistor to the third separated contact, and wherein the second interconnect structure electrically connects a gate terminal on the active surface of the second transistor to the fourth separated contact.

17. The method of claim 1, wherein providing the first transistor including first interconnect structure includes successively forming alternating insulating layers and conducting layers over the active surface of the first transistor, and electrically coupling the source terminal on the active surface of the first transistor to the common contact using at least one of the conducting layers and at least one conductive via through at least one of the insulating layers.

18. A method of making a semiconductor device, comprising:
    providing a leadframe including a common contact;
    providing a first transistor including a first interconnect structure formed over an active surface of the first transistor;
    providing a second transistor including a second interconnect structure formed over an active surface of the second transistor;
    disposing the first transistor over the leadframe with the first interconnect structure on the common contact; and
    disposing the second transistor over the leadframe with second interconnect structure on the common contact,
    wherein a source terminal of the first transistor is electrically coupled to the common contact, and a drain terminal of the second transistor is electrically coupled to the common contact, and
    wherein both of the source terminal of the first transistor and the drain terminal of the second transistor are formed on the active surfaces of the first transistor and the second transistor, respectively, and
    wherein the both of the source terminal of the first transistor and the drain terminal of the second transistor are electrically coupled to the common contact via the first interconnect structure and the second interconnect structure, respectively.

* * * * *